United States Patent [19]

Jeng

[11] Patent Number: 5,508,215

[45] Date of Patent: Apr. 16, 1996

[54] CURRENT LEAKAGE REDUCTION AT THE STORAGE NODE DIFFUSION REGION OF A STACKED-TRENCH DRAM CELL BY SELECTIVELY OXIDIZING THE FLOOR OF THE TRENCH

[75] Inventor: Nanseng Jeng, Boise, Id.

[73] Assignee: Micron Technology, Inc., Boise, Id.

[21] Appl. No.: 370,999

[22] Filed: Jan. 9, 1995

Related U.S. Application Data

[62] Division of Ser. No. 92,731, Jul. 15, 1993, Pat. No. 5,416,348.

[51] Int. Cl.⁶ ................................................ H01L 21/70
[52] U.S. Cl. .................... 437/38; 437/24; 437/60; 437/919
[58] Field of Search ................ 437/24, 26, 38, 437/60, 158, 238, 203, 919, 938, 67, 52

[56] References Cited

U.S. PATENT DOCUMENTS

| | | | |
|---|---|---|---|
| 4,371,403 | 2/1983 | Ikubo et al. | 437/24 |
| 4,894,695 | 1/1990 | Ishii et al. | 437/67 |
| 5,183,775 | 2/1993 | Levy | 437/24 |
| 5,342,792 | 8/1994 | Yonehara | 437/38 |
| 5,372,950 | 12/1994 | Kim et al. | 437/24 |

FOREIGN PATENT DOCUMENTS

| | | | |
|---|---|---|---|
| 3-46344 | 2/1991 | Japan | 437/24 |
| 4-37152 | 2/1992 | Japan | 437/38 |

Primary Examiner—George Fourson
Assistant Examiner—S. Mulpuri
Attorney, Agent, or Firm—Angus C. Fox, III; Holland & Hart

[57] ABSTRACT

This invention constitutes a process for fabricating a structure which, when incorporated in an integrated circuit, will reduce current leakage into the substrate from transistor source/drain regions. The structure is particularly useful in dynamic random access memories, as it will minimize the effect of alpha particle radiation, thus improving the soft error rate. A trench is etched through the transistor source or drain region. A high dosage of oxygen ions is then implanted at low energy in the floor, but not the sidewalls of the trench. The resulting oxygen-implanted silicon layer at the bottom of the trench is then converted to a silicon dioxide barrier layer through rapid thermal processing or furnace annealing in an inert ambiance. The trench is then lined with a deposited contact layer that is rendered conductive either during or subsequent to deposition. Contact between the contact layer and the source or drain region is made through the sidewalls of the trench, which were not implanted with oxygen. The presence of the silicon dioxide barrier layer in a dynamic random access memory cell dramatically reduces the soft error rate by greatly reducing the area through which cell discharge can occur.

3 Claims, 2 Drawing Sheets

CURRENT LEAKAGE REDUCTION AT THE STORAGE NODE DIFFUSION REGION OF A STACKED-TRENCH DRAM CELL BY SELECTIVELY OXIDIZING THE FLOOR OF THE TRENCH

"This is a request for filing a Divisional application Ser. No. 08/092,731 filed 7/15/93, U.S. Pat. No. 5,416,348.

FIELD OF THE INVENTION

This invention relates to the formation of a insulative layer at the bottom of a trench within a silicon substrate. More particularly, it relates to dynamic random access memory cells employing stacked-trench type capacitors.

BACKGROUND OF THE INVENTION

Traditional integrated circuit transistor structures rely on the existence of reverse-biased diodes to minimize current leakage from the transistors source, drain, and channel regions to the substrate. Although a reverse-biased diode represents a relatively high resistance current path, there is still significant leakage. A low-resistance current path would be formed if the voltage differential between the substrate and the source/drain regions were to reach the Zener level, at which point avalanche breakdown would occur. Although most integrated circuits operate with voltage differentials far below the Zener level, current leakage at normal operating voltages can still be problematic. In a dynamic random access memory (DRAM), for example, the greater the junction leakage, the more frequent the refresh cycle.

In DRAM memories, the reverse-biased diode formed between the storage node and the substrate can become a low-resistance current path through which the storage node will be partially or completely discharged if an alpha particle of radiation impacts the storage node. Hole-electron pairs are created as the alpha particle traverses the silicon lattice. In a positively charged storage node, the holes (being attracted by the electric field within the junction's depletion region) cross the junction and combine with electrons in the substrate, while the electrons combine with the holes in the positively-charged storage node, depleting the charge.

What is needed is a structure and an uncomplicated process for producing the same which will reduce junction leakage and minimize the effect of alpha particle hits.

SUMMARY OF THE INVENTION

This invention constitutes a process for fabricating a structure which, when incorporated in an integrated circuit, will reduce current leakage into the substrate from transistor source/drain regions. The structure is particularly useful in dynamic random access memories, as it will minimize the effect of alpha particle radiation, thus improving the soft error rate. A trench is etched through the transistor source or drain region. A high dosage of oxygen ions is then implanted at low energy in the floor, but not the sidewalls of the trench. The resulting oxygen-implanted silicon layer at the bottom of the trench is then converted to a silicon dioxide barrier layer through rapid thermal processing or furnace annealing in an inert ambiance. The trench is then lined with a deposited contact layer that is rendered conductive either during or subsequent to deposition. Contact between the contact layer and the source or drain region is made through the sidewalls of the trench, which were not implanted with oxygen. The presence of the silicon dioxide barrier layer in a dynamic random access memory cell dramatically reduces the soft error rate by greatly reducing the area through which cell discharge can occur.

PREFERRED EMBODIMENT OF THE INVENTION

The process will be described in terms of the fabrication of a dynamic random access memory. It is to be understood that certain structures of the cell design, such as the gate composition and semi-recessed field oxide, are a matter of design choice.

Figure 1:
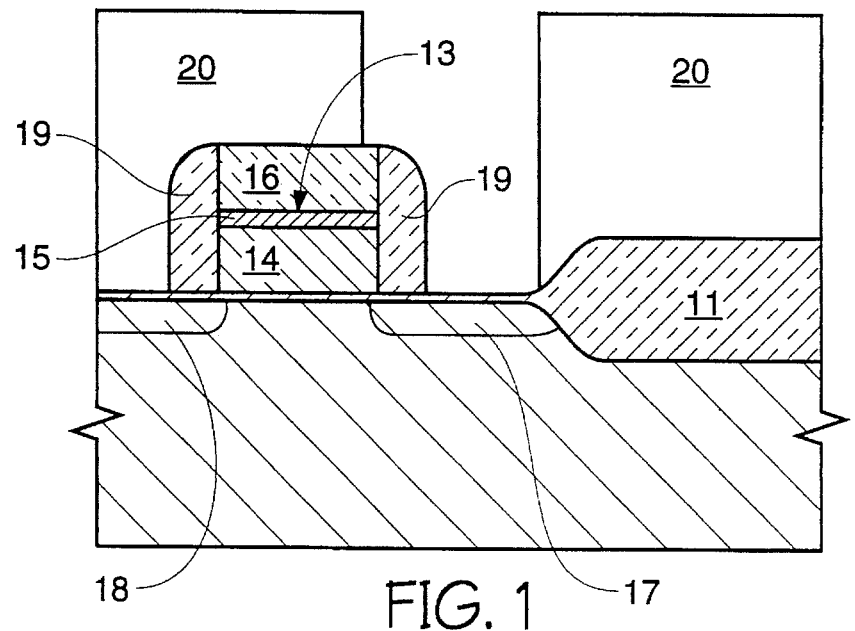
FIG. 1 is a cross-sectional view of an in-process DRAM cell following a masking step which exposes the storage node contact region.

Referring now to FIG. 1, an in process dynamic random access memory cell is depicted. It should be understood that thousands to millions of cells are being fabricated simultaneously on each memory device, of which there may be several hundred present on a given wafer. At this stage of processing, a field oxide region 11 has been formed, a gate oxide layer 12 overlies the circuitry in regions of no field oxide. An access transistor gate 13 has been previously patterned from a stack of layer comprising a conductive polycrystalline silicon layer 14, a refractory metal silicide layer 15, and a thick insulative layer 16. A storage node diffusion region 17 and an access node diffusion region 18 have been formed through various implantation and diffusion steps. Additionally, dielectric spacers 19 have been formed on the sidewalls of the access transistor gate 13. A storage node contact mask 20 has been formed such that the storage node contact region of the cell is exposed.

Figure 2:
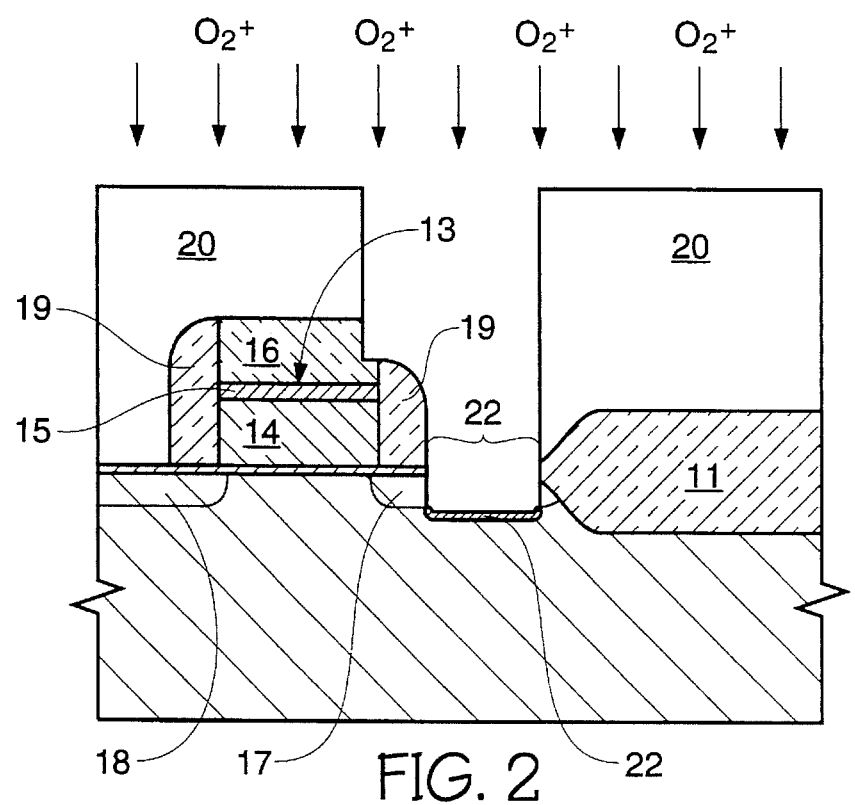
FIG. 2 is a cross-sectional view of the in-process DRAM cell of FIG. 1 following both an anisotropic etch step which has trenched the silicon within the storage-node diffusion region of the cell and a high-dosage, low-energy oxygen implant.

Referring now to FIG. 2, the cell of FIG. 1 has been subjected to an anisotropic etch which has etched through the storage node diffusion region 17, thus forming a trench 21. It should be mentioned that the term "anisotropic" literally means not omnidirectional. However, in the semiconductor industry, the term anisotropic is usually meant to define an etch that is unidirectional (i.e., etches principally straight down). Following the anisotropic etch, the cell is subjected to a high-dosage, low-energy implant, which creates an oxygen-embedded layer 22 in the silicon at the bottom of the trench. Implant energies of less than 30 KeV, and oxygen ion dosage levels of greater than $1 \times 10^{16}$ ions/cm$^2$ are recommended.

Figure 3:
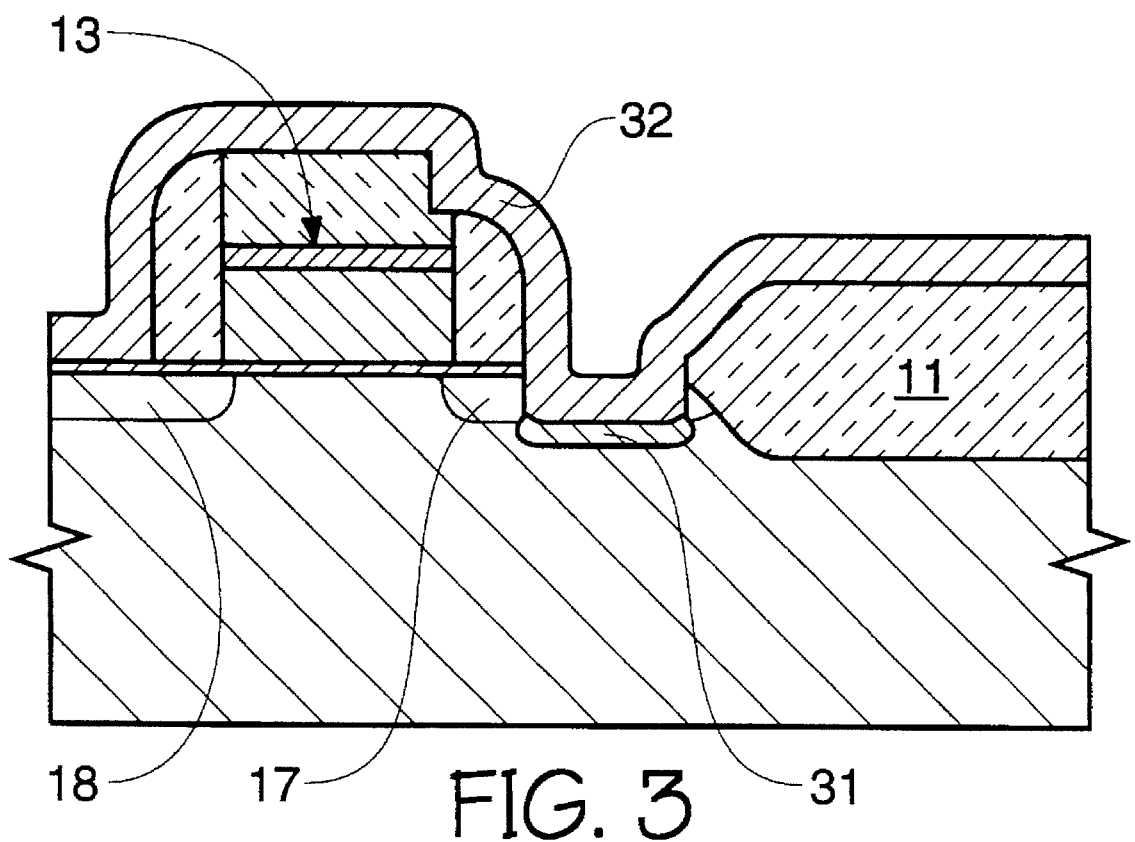
FIG. 3 is a cross-sectional view of the in-process DRAM cell of FIG. 2 following a stripping of the mask and the deposition of a contact layer.

Referring now to FIG. 3, the mask 20 has been stripped from the cell of FIG. 2, and the cell has been subjected to rapid thermal processing or a furnace anneal step in an inert ambiance such as argon, which has converted the oxygen-embedded layer 22 to a silicon dioxide barrier layer 31. Finally, a contact layer 32 is deposited such that it lines the sidewalls and bottom of the trench 21. In a DRAM cell, the contact layer 32 forms the bottom plate of the cell capacitor. Hence, by definition, since the bottom plate of the cell capacitor covers a portion of the access transistor gate and also lines a trench, this cell has a stacked-trench configuration. It will be apparent that since the trench was etched through the storage node diffusion region 17, and that since implantation of oxygen occurred only at the bottom of the trench 21, the contact layer 32 contacts the storage node diffusion region 17 through the sidewall of the trench 21. In an equivalent embodiment, the contact layer 32 is deposited without an elevated temperature anneal step. Subsequent elevated temperature steps inherent to DRAM fabrication processes will convert the oxygen-embedded substrate layer 22 to the silicon dioxide barrier layer 31.

The DRAM cell structure formed by this process has several advantages. Firstly, leakage current through the junction is dramatically reduced because junction area has been reduced. Secondly, soft error rate will be improved, as the recombination path is severed by the silicon dioxide barrier layer 31. Thirdly, leakage sensitivity resulting from thermal cycling during processing will be reduced. This is because leakage sensitivity is dependent on the doping profiles across the junction. With the presence of the barrier layer 31, junction area is greatly reduced. Thus, leakage sensitivity from thermal cycling is also reduced.

Although only several embodiments of the invention is disclosed herein, it will be obvious to those having ordinary skill in the art of semiconductor manufacture that changes and modifications may be made thereto without departing from the scope and the spirit of the invention as hereinafter claimed.

I claim:

1. A method for manufacturing a dynamic random access memory cell on a silicon substrate, said method comprising the following steps:

(a) forming an access transistor gate electrode on an upper surface of the substrate, said gate electrode having an upper surface and sidewalls;

(b) forming source/drain regions on opposite sides of the gate electrode, one of said source/drain regions to function as the cell's access node region, and the other to function as the cell's storage node region;

(c) forming dielectric spacers on the sidewalls of said gate electrode;

(d) etching a trench in the substrate, said trench having vertical sidewalls and a floor, and at least one vertical sidewall of said trench abutting the source/drain region which is to function as the cell's storage node region;

(e) implanting oxygen ions at dosage greater than $1 \times 10^{16}/cm^2$ and at energy lower than 30 Kev in the floor of said trench; and (f) performing elevated temperature anneal step following implantation of the oxygen ions; and then (g) forming a bottom plate for cell capacitor which at least partially lines the trench and which makes contact to the source/drain region which is to function as the cell's storage node region through the abutting sidewall.

2. The method of manufacturing of claim 1, wherein said bottom plate overlies at least a portion of the gate electrode.

3. The process of claim 1, wherein the elevated temperature anneal step is performed in an inert ambiance.

* * * * *